United States Patent [19]

Aoshima

[11] Patent Number: 5,300,397
[45] Date of Patent: Apr. 5, 1994

[54] LIGHT-SENSITIVE COMPOSITION COMPRISING A DIAZONIUM COMPOUND AND A MACROMER AS THE POLYMERIC BINDER

[75] Inventor: Keitaro Aoshima, Shizuoka, Japan

[73] Assignee: Fuji Photo Film Co., Ltd., Minami-Ashigara, Japan

[21] Appl. No.: 898,330

[22] Filed: Jun. 15, 1992

[30] Foreign Application Priority Data

Jun. 19, 1991 [JP] Japan .................... 3-147603

[51] Int. Cl.⁵ ............... G03F 7/016; G03F 7/021; G03C 1/77
[52] U.S. Cl. ........................ 430/176; 430/157; 430/175; 430/302; 525/285; 525/286; 525/292; 525/302; 525/328.5; 522/32
[58] Field of Search .............. 430/175, 176, 157, 302; 525/286, 328.5, 302, 292, 285; 522/32

[56] References Cited

U.S. PATENT DOCUMENTS

| | | | |
|---|---|---|---|
| 4,282,301 | 8/1981 | Ohta | 430/157 |
| 4,687,727 | 8/1987 | Toyama et al. | 430/175 |
| 4,774,161 | 9/1988 | Sekiya et al. | 430/175 |
| 5,047,309 | 9/1991 | Koike et al. | 430/175 |
| 5,112,743 | 5/1992 | Kamiya et al. | 430/176 |
| 5,240,808 | 8/1993 | Aoshima et al. | 430/175 |

Primary Examiner—Charles L. Bowers, Jr.
Assistant Examiner—John S. Chu
Attorney, Agent, or Firm—Burns, Doane, Swecker & Mathis

[57] ABSTRACT

A light-sensitive composition comprising a diazonium compound and a polymer binder wherein the polymer binder comprises structural units represented by the following formula (I);

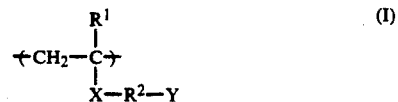

wherein X represents a single bond, an ester bond or an amide bond; and Y represents a polymer group comprising structural units represented by the following formula (II);

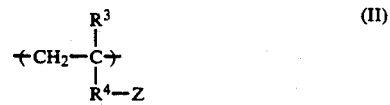

where Z represents

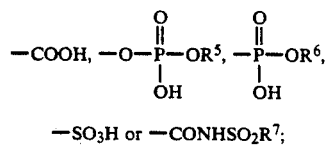

$-SO_3H$ or $-CONHSO_2R^7$;

$R^1$ and $R^3$ represent hydrogen atom or methyl group; $R^2$ and R represent a single bond or a divalent bridging group; and $R^5$ and $R^6$ represent hydrogen atom or optionally substituted hydrocarbon group having 1 to 15 carbon atoms; and $R^7$ represents an optionally substituted hydrocarbon group having 1 to 15 carbon atoms. The present light-sensitive composition exhibits extremely enhanced sensitivity and hence gives sufficient image formation with a short light exposure time.

20 Claims, No Drawings

LIGHT-SENSITIVE COMPOSITION COMPRISING A DIAZONIUM COMPOUND AND A MACROMER AS THE POLYMERIC BINDER

BACKGROUND OF THE INVENTION

1. Field of the Invention

The present invention relates to a light-sensitive composition suitable for producing a presensitized plate for use in making lithographic printing plates (hereinafter referred to as "PS plate(s)"), IC circuits, photomasks or the like and more particularly to a negative working light-sensitive composition comprising a diazonium compound and a polymer binder, which exhibits improved sensitivity on light exposure.

2. Prior Art

Most of the light-sensitive compounds used in negative working light-sensitive compositions are diazonium compounds and most commonly used are diazo resins such as a condensate of p-diazodiphenylamine and formaldehyde.

The light-sensitive composition for producing light-sensitive layers of PS plates can be classified into two groups, one of which simply comprises diazo resins, in other words those free of binders as disclosed in U.S. Pat. No. 2,714,066 and the other of which comprises both diazo resins and binders as disclosed in Japanese Patent Un-examined Publication (hereafter referred to as "J. P. KOKAI") No. Sho 50-30604. However, recently, most of the light-sensitive layers of the PS plates comprise diazonium compounds and polymers serving as binders for the purpose of imparting high printing durability to the plates.

As such a light-sensitive layer, there have been known so-called alkali-developable ones whose unexposed portions are removed (or developed) with an aqueous alkaline developer as disclosed in J. P. KOKAI No. Sho 50-30604 and so-called solvent-developable ones whose unexposed portions are removed (or developed) with an organic solvent type developer, but the former has become of major interest recently from the viewpoint of safety in operation and health of operators. Such development types of the light-sensitive layer are determined principally depending on properties of binders used. As the method for making the binders alkali-soluble, there have been known a method as disclosed in J. P. KOKAI No. Sho 50-30604 which comprises copolymerizing carboxyl group-containing monomers to obtain such a binder and a method as disclosed in U.S. Pat. No. 2,861,058 which comprises reacting hydroxyl groups of polyvinyl alcohol with a cyclic acid anhydride such as phthalic acid anhydride to introduce carboxyl groups into the resultant polymers.

However, light-sensitive compositions comprising such polymers cannot have enough sensitivity to produce a sufficiently acceptable image with a short light exposure time.

SUMMARY OF THE INVENTION

Therefore, the object of the present invention is to provide a highly sensitive negative working light-sensitive composition comprising a polymer binder, which enables sufficient image formation with a short light exposure time.

We have conducted various studies to achieve the foregoing object of this invention and have found that the object can effectively be achieved by a novel light-sensitive composition comprising a specific polymer binder.

The present invention relates to a light-sensitive composition comprising a diazonium compound and a polymer binder wherein the polymer binder comprises structural units represented by the following formula (I);

wherein $R^1$ represents hydrogen atom or methyl group; X represents a single bond, an ester bond or an amide bond; $R^2$ represents a single bond or a divalent bridging group composed of two or more kinds of atoms selected from the group consisting of C, H, N, O and S; and Y represents a polymer group having a weight average molecular weight of not less than 500 and comprising structural units represented by the following formula (II);

where $R^3$ represents hydrogen atom or methyl group; $R^4$ represents a single bond or a divalent bridging group composed of two or more kinds of atoms selected from the group consisting of C, H, N, O and S; and Z represents

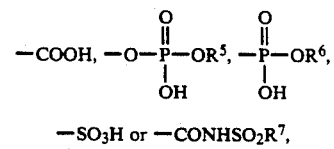

$-SO_3H$ or $-CONHSO_2R^7$, where $R^5$ and $R^6$ independently represent hydrogen atom or an optionally substituted hydrocarbon group having 1 to 15 carbon atoms; and $R^7$ represents an optionally substituted hydrocarbon group having 1 to 15 carbon atoms.

DETAILED DESCRIPTION OF THE INVENTION

The polymer binder comprising the units of the formula (I) used in the present invention is obtained by radical polymerization of macromers (macromolecular monomers) represented by the following formula (III);

In the formula (III), $R^1$, $R^2$, X and Y have the same meanings defined above.

The macromer of the present invention may be prepared by a conventional method. For example, it may be prepared by the radical polymerization method, that is, it may be prepared by reacting oligomers having a terminal reactive group, which is obtained by radical polymerization using a polymerization initiator and/or chain transfer agent containing reactive groups such as carboxyl, halogenoacyl, hydroxyl, amino, halogeno and epoxy groups, with various compounds.

More specifically, the macromer can be prepared in accordance with the methods described in P. Dreyfuss & R. P. Quirk, Encycl. Polym. Sci. Eng., 7, 551 (1987); P. F. Rempp, & E. Franta, Adv. Polym. Sci., 58, 1 (1984); Y. Kawakami, Kagaku Kogyo (Chemical Industry), 38, 56 (1987); Y. Yamashita, Kobunsi (Macromolecule), 31, 988 (1982); S. Kobayashi, Kobunshi (Macromolecule), 30, 625 (1981); K. Ito, Kobunshi Kako (Processing of Polymer Material), 35, 262 (1986) and T. Azuma & T. Tsuda, Kino Zairyo (Functional Material), 10, 5 (1987) and the literature and the patent documents cited therein, of which disclosures are totally incorporated herein by reference.

The macromers used in the resent invention contain acidic groups in the repeating units represented by the general formula (II). Therefore, the macromers are prepared, for instance, in accordance with the following Reaction Scheme (1). In Reaction Scheme (1), monomers having the acidic groups protected by suitable protective groups are polymerized through radical polymerization by the methods mentioned above to prepare the macromer having the terminal reactive group.

62-212669 (=Brit. Pat. No. 2189892), Sho 62-286064, Sho 62-210475 (=U.S. Pat. No. 4,929,526), Sho 62-195684 (=U.S. Pat. No. 4,929,526), Sho 62-258476 (=U.S. Pat. No. 4,828,952), Sho 63-260439, Hei 1-70767; and U.S. Pat. No. 4,910,112, of which disclosures are totally incorporated herein by reference.

The macromer may also be prepared in accordance with the following Reaction Scheme (2), wherein an oligomer, which is prepared in the same manner as described above and has a specific reactive group at one terminal thereof, is reacted with a compound having a polymerizable double bond. The compound having a polymerizable double bond is reactive only to the specific reactive group contained in the oligomer because of the difference of reactivity between the specific reactive group and the acidic group contained in the oligomer.

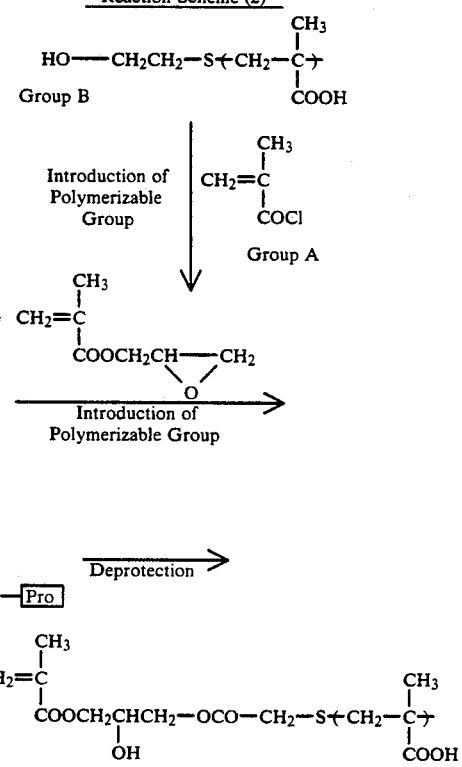

Reaction Scheme (1):

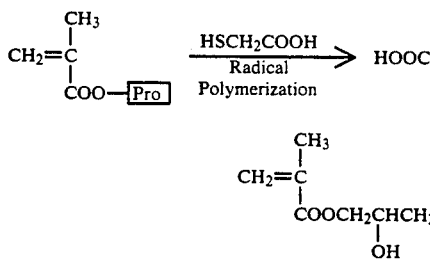

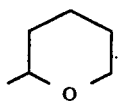

The symbol of [Pro] represents a protective group of —COOH such as —C(C₆H₅)₃, —Si(CH₃)₂(t-C₄H₉) and The introduction reaction of the protective groups and the deprotection reaction such as hydrolysis, hydrogenolysis and oxidative degradation reactions for the acidic groups contained in the macromers of the invention may be carried out by conventional methods. For example, they may be carried out by the methods described in J. F. W. McOmie, Protective Groups in Organic Chemistry, Plenum Press (1973); T. W. Greene, Protective Groups in Organic Synthesis, John Wiley & Sons (1981); R. Oda, Kobunsi Fine Chemical (Macromolecular Fine Chemical), Kodansha (1976); Y. Iwakura, K. Kurita, Hannosei Kobunshi (Reactive Macromolecule), Kodansha (1977); G. Berner et al, J. Radiation Curing, 10, 10 (1986); J. P. KOKAI Nos. Sho

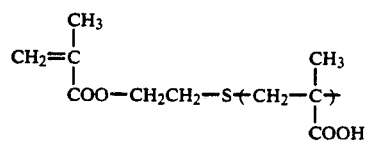

The combination of the reactive functional groups A and B, which are —COCl and —OH in Reaction Scheme (2) described above, may be selected from those mentioned in Table A below. However, the present invention is not limited thereto, and any combination of the functional groups may be used so long as the macromer can be prepared without protecting the acidic groups contained in the macromer by utilizing the reactional selectivity under normal conditions of organic reaction.

TABLE A

| Functional group A | Functional group B |
| --- | --- |
| —COCl, acid anhydride, —SO₂Cl | —OH, —NHR⁸ |
| —COOH, —NHR⁸ —OH, —NHR⁸ | Halogeno group —COCl, —SO₂Cl |

$R^8$ is a hydrogen atom or optionally substituted hydrocarbon group having 1 to 15 carbon atoms and preferably a hydrogen atom.

The macromer may further be prepared in accordance with the following Reaction Scheme (3), wherein a macromer having functional groups which may be substituted by the acidic groups, for example, hydroxyl groups, is prepared by the method described above and then the acidic groups are introduced into the macromer.

Reaction Scheme (3)

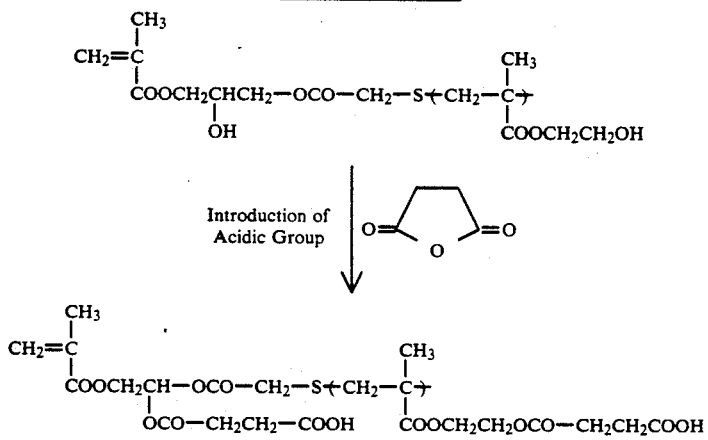

Though the acidic groups are introduced into the macromer in Reaction Scheme (3), the macromer may be polymerized through radical polymerization before the introduction of the acidic groups to have a polymer and then the acidic groups may be introduced into the polymer to prepare the polymer of the invention.

The structural unit represented by the formula (II) preferably has a structure selected from the following units:

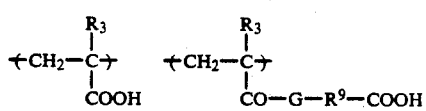

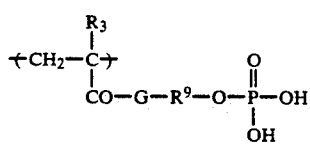

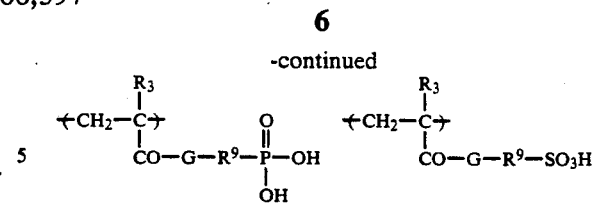

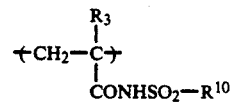

In the above formulae, $R^3$ represents a hydrogen atom or methyl group; G represents —O— or —NH—; $R^9$ represents an optionally substituted hydrocarbon bridging group having 1 to 15 carbon atoms and $R^{10}$ represents an optionally substituted hydrocarbon group having 1 to 15 carbon atoms. Preferred examples of the unit include the following units;

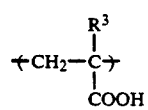

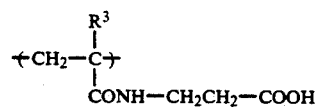

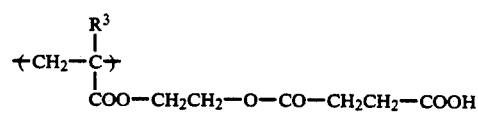

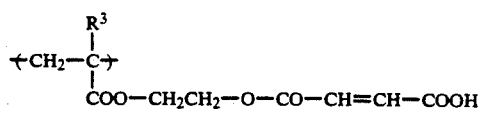

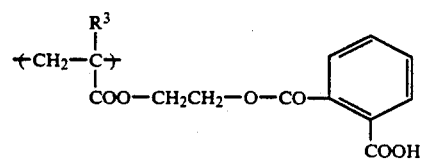

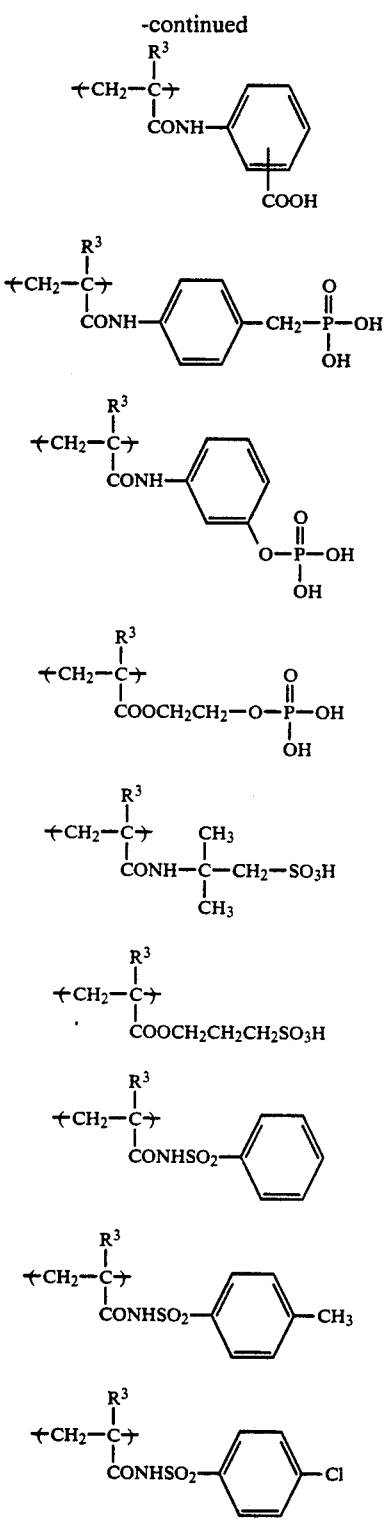

Preferred examples of the chain transfer agent used in the synthesis of the macromer include mercapto compounds having the above-mentioned reactive group such as thioglycolic acid, thiomalic acid, thiosalicylic acid, 2-mercaptpropionic acid, 3-mercaptopropionic acid, 3-mercaptobutyric acid, N-(2-mercaptopropyonyl)glycine, 2-mercaptonicotinic acid, 3-[N-(2-mercaptoethyl)carbamoyl]propionic acid, 3-[N-(2-mercaptoethyl) amino]propionic acid, N-(3-mercaptopropionyl)alanine, 2-mercaptoethanesulfonic acid, 3-mercaptopropanesulfonic acid, 4-mercaptobutanesulfonic acid, 2-mercaptoethanol, 3-mercapto-1,2-propanediol, 1-mercapto-2-propanol, 3-mercapto-2-butanol, mercaptophenol, 2-mercaptoethylamine, 2-mercaptoimidazole and 2-mercapto-3-pyridinol, disulfide compounds which are the oxidized compounds of the foregoing mercapto compounds and iodinated alkyl compounds such as iodoacetic acid, iodopropionic acid, 2-iodoethanol, 2-iodoethanesulfonic acid and 3-iodopropanesulfonic acid. Among those compounds, particularly preferred are the mercapto compounds.

Preferred examples of the polymerization initiator having the specific reactive group include 2,2'-azobis(2-cyanopropanol), 2,2'-azobis(2-cyanopentanol), 4,4'-azobis(4-cyanovaleric acid), 4,4'-azobis(4-cyanovaleric acid chloride), 2,2'-azobis[2-(5-methyl-2-imidazoline-2-yl)propane], 2,2'-azobis[2-(2-imidazoline-2-yl)propane], 2,2'-azobis[2-(3,4,5,6-tetrahydropyrimidine-2-yl)propane], 2,2'-azobis {2-[1-(2-hydroxyethyl)-2-imidazoline-2-yl]propane}, 2,2'-azobis[2-methyl-N-(2-hydroxyethyl)-propionamide] and the derivatives thereof.

These chain transfer agents and the polymerization initiators are used in an amount of 0.1 to 15% by weight, preferably 0.5 to 10% by weight of the total weight of the monomers.

Though the structural unit of the formula (I) may totally be composed of the unit of the formula (II), it may contain other structural units. In such a case, the macromer can be prepared by polymerizing the monomers for the unit of the formula (II) in the presence of the other polymerizable monomers.

Examples of such polymerizable monomers include compounds having polymerizable unsaturated bond such as those selected from the group consisting of acrylates, acrylamides, methacrylates, methacrylamides, allyl compounds, vinyl ethers, vinyl esters, styrenes and crotonates. More specifically, there may be mentioned such acrylates as alkyl (preferred carbon atoms thereof ranges from 1 to 10) acrylates, for instance, methyl acrylate, ethyl acrylate, propyl acrylate, butyl acrylate, amyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate, and aryl acrylates, for instance, phenyl acrylate; such methacrylates as alkyl (preferred carbon atom number thereof ranges from 1 to 10) methacrylates, for instance, methyl methacrylate, ethyl methacrylate, propyl methacrylate, iso-propyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate, and aryl methacrylates, for instance, phenyl methacrylate, cresyl methacrylate and naphthyl methacrylate; such acrylamides as acrylamide, N-alkylacrylamides (the alkyl group thereof are those having 1 to 10 carbon atoms, such as methyl, ethyl, propyl, butyl, t-butyl, heptyl, octyl, cyclohexyl, hydroxyethyl and benzyl), N-arylacrylamides (examples of the aryl groups include phenyl, tolyl, nitrophenyl, naphthyl, hydroxyphenyl and sulfamoylphenyl), N,N-dialkylacrylamides (examples of the alkyl group are those having 1 to 10 carbon atoms, for instance, methyl, ethyl, butyl, isobutyl, ethylhexyl and cyclohexyl), N,N-diarylacrylamides (examples of the aryl groups include phenyl), N-methyl-N-phenylacrylamide, N-hydroxyethyl-N-methylacrylamide and N-(2-acetamido)-ethyl-N-acetyl acrylamide; such methacrylamides as methacrylamide, N-alkylmethacrylamides (examples of the alkyl group thereof are those having 1 to 10 carbon atoms such as methyl, ethyl, t-butyl, ethylhexyl, hydroxyethyl and cyclohexyl), N-arylmethacrylamides (examples of aryl group thereof include phenyl, hydroxyphenyl and sulfamoylphenyl), N,N-dialkylmethacrylamides (examples of the alkyl group include ethyl, propyl and butyl), N,N-diarylmethacrylamides (examples of aryl group thereof include phenyl), N-hydroxyethyl-N-methylmethacrylamide, N-methyl-N-phenylmethacrylamide and N-ethyl-N-phenylmethacrylamide; such allyl compounds as allyl esters, for instance, allyl acetate, allyl caproate, allyl caprylate, allyl laurate, allyl palmitate, allyl stearate, allyl benzoate, allyl acetoacetate and allyl lactate, and allyloxyethanol; such vinyl ethers as alkyl vinyl ethers, for instance, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether; vinyl aryl ethers, for instance, vinyl phenyl ether, vinyl tolyl ether, vinyl chlorophenyl ether, vinyl 2,4-dichlorophenyl ether, vinyl naphthyl ether and vinyl anthranyl ether; such vinyl esters as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl$\beta$-phenylbutylate, vinyl cyclohexylcarboxylate, vinyl benzoate, vinyl salicylate, vinyl chlorobenzoate, vinyl te trachlorobenzoate and vinyl naphthoate; such styrenes as styrene, alkyl styrenes, for instance, methyl styrene, dimethyl styrene, trimethyl styrene, ethyl styrene, diethyl styrene, isopropyl styrene, butyl styrene, hexyl styrene, cyclohexyl styrene, decyl styrene, benzyl styrene, chloromethyl styrene, trifluoromethyl styrene, ethoxymethyl styrene and acetoxymethyl styrene, alkoxy styrenes, for instance, methoxy styrene, 4-methoxy-3-methyl styrene and dimethoxy styrene, halogenostyrenes, for instance, chlorostyrene, dichlorostyrene, trichloro-styrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene; such crotonates as alkyl crotonates, for instance, butyl crotonate, hexyl crotonate and glycerin monocrotonate; such dialkyl itaconates as dimethyl itaconate, diethyl itaconate and dibutyl itaconate; such dialkyl maleates or fumarates as dimethyl maleate and dibutyl fumarate; acrylonitrile and methacrylonitrile.

Among these polymerizable monmers, preferably used are acrylates, methacrylates, acrylamides, methacrylamides, acrylonitrile and methacrylonitrile.

The group Y in the formula (I) consists of 5 to 100% by weight, preferably 20 to 100% by weight of the structural units of the formula (II).

Though the polymer binder of the present invention may be totally composed of the structural units of the formula (I), it preferably contains other structural units. Such a polymer binder may be prepared by polymerizing other polymerizable monomers with the macromers.

Examples of such polymerizable monomers include acrylates, methacrylates, acrylamides, methacrylamides, allyl compounds, vinyl ethers, vinyl esters, styrenes and crotonates.

Among these polymerizable monomers, preferably used are the foregoing acrylates, methacrylates, acrylamides, methacrylamides, acrylonitrile, methacrylonitrile, acrylic acid and methacrylic acid.

The obtained copolymer preferably comprises at least 1%, more preferably 5 to 80% by weight of the structural units of the formula (I).

The copolymers may contain 2 or more kinds of the structural units of the formula (I) and may contain the structural units of the formula (II) in their backbones.

In the polymer binders of the invention, their backbones and the group Y in the formula (II) may be block copolymers or random copolymers.

The weight average molecular weight of the macromers used in the invention is preferably not less than 500 and more preferably ranges from 700 to 200,000. With respect to the polymer binder of the invention, the average molecular weight is preferably not less than 2,000 and more preferably ranges from 5,000 to 300,000, the number average molecular weight is not less than 800 and more preferably ranges from 1,000 to 250,000 and the polydispersity (weight average molecular weight/number average molecular weight) is preferably not less than 1 and more preferably ranges from 1.1 to 10.

The polymer binders of the invention may contain unreacted monomers and macromers. In such a case, it is preferred that the polymer binders contain not more than 15% by weight of the unreacted compounds.

These polymer binders may be prepared in the presence of a solvent such as ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide and water. These solvents may be used alone or in any combination.

In the present invention, the polymer binders may also be used alone or in any combination. The amount of the polymer binder to be incorporated into the light-sensitive composition of this invention generally ranges from about 5 to 95% by weight and preferably about 10 to 90% by weight on the basis of the total weight of the composition.

Examples of the negative working diazonium compounds herein used are diazonium compounds as disclosed in U.S. Pat. No. 3,867,147 and those disclosed in U.S. Pat. No. 2,632,703 and particularly preferred are diazo resins such as condensates of aromatic diazonium salt and, for instance, an active carbonyl group-containing compound such as formaldehyde. Examples of preferred diazo resins are reaction products obtained by condensing a diazo monomer listed below with a condensing agent in a molar ratio ranging from 1:1 to 1:0.5, preferably 1:0.8 to 1:0.6 in the usual manner and then reacting the resulting condensate with an anion.

Examples of the diazo monomers are 4-diazodiphenylamine, 1-diazo-4-N,N-dimethylaminobenzene, 1-diazo-4-N,N-diethylaminobenzene, 1-diazo-4-N-ethyl-N-hydroxy ethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-N,N-dimethylaminobenzene, 1-diazo-4-morpholinobenzene, 1-diazo-2,5-dimethoxy-4-p-t olylmercaptobenzene, 1-diazo-2-ethoxy-4-N,N-dimethylaminobenzene, p-diazo-dimethylaniline, 1-diazo-2,5-dibutoxy-4 morpholinobenzene, 1-diazo-2,5-diethoxy-4-morpholinobenzene, 1-diazo-2,5-dimethoxy-4-morpholinobenzene, 1-diazo-2,5-diethoxy-4-morpholinobenzene, 1-diazo-2,5-diethoxy-4-p-toly-mercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrroridinobenzene, 1-diazo-2-chloro-4-N,N-dimethylamino-5-methoxybenzene, 1-diazo-3-methoxy-4-pyrroridinobenzene, 3-methoxy-4-diazodiphenylamine, 3-ethoxy-4-diazodiphenylamine, 3-(n-propoxy)-4-diazodiphenylamine and 3-isopropoxy-4-diazodiphenylamine.

Examples of the condensing agents are formaldehyde, acetaldehyde, propionaldehyde, butylaldehyde, isobutylaldehyde and benzaldehyde.

Examples of the anions are tetrafluoroboric acid residue, hexafluorophosphoric acid residue, triisopropylnaphthalenesulfonic acid residue, 5-nitro-o-toluenesulfonic acid residue, 5-sulfosalicylic acid residue, 2,5-dimethylbenzenesulfonic acid residue, 2,4,6-trimethylbenzenesulfonic acid residue, 2-nitrobenzenesulfonic acid residue, 3-chlorobenzenesulfonic acid residue, 3-bromobenzenesulfonic acid residue, 2-fluorocaprylnaphthalenesulfonic acid residue, dodecylbenzenesulfonic acid residue, 1-naphthol-5-sulfonic acid residue, 2-methoxy-4-hydroxy-5-benzoylbenzenesulfonic acid residue and p-toluenesulfonic acid residue. Among these anions, preferred are hexafluorophosphoric acid residue and alkyl aromatic sulfonic acid residue such as triisopropyl-naphthalenesulfonic acid residue and 2,5-dimethylbenzenesulfonic acid residue.

Useful examples of the diazo resins further include those obtained by condensing the foregoing diazo monomer and an aldehyde having a carboxyl and/or phenol group or its acetal (and optionally the foregoing condensing agent) and then reacting the condensate with the foregoing anion; as well as the diazo resins as disclosed in J. P. KOKAI Nos. Hei 1-102456 and Hei 1-102457. Particularly preferred are those containing carboxylic acid residues.

These diazo resins are used in an amount of 1 to 50% by weight, preferably 3 to 35% by weight on the basis of the total weight of the composition. The light-sensitive composition of the invention may contain two or more kinds of diazonium compounds.

The light-sensitive composition of the present invention may further comprise, in addition to the polymer binder containing the structural units represented by the formula (I), known alkali-soluble polymer binders such as phenol-formaldehyde resin, cresol-formaldehyde resin, phenol modified xylene resin, polyhydroxystyrene, polyhalogenated hydroxystyrene, carboxyl group-containing epoxy resin, polyacetal resin, acrylic resin, methacrylic resin and carboxyl group-containing polyurethane resin. Such alkali-soluble polymer binders are used in a amount of not more than 70% by weight of the total weight of the composition.

The light-sensitive composition of the present invention may further contain other additives such as agents or composition for obtaining a visible image immediately after imagewise exposure; dyes or pigments for dying images; stabilizers; surfactants; plasticizers and/or other fillers.

Typical examples of the agents or composition for obtaining a visible image immediately after imagewise exposure include a combination of a light-sensitive compound which releases an acid during exposing it to light and an organic dye capable of forming a salt with the acid released. Specific examples thereof are a combination of o-naphthoquinone-diazido-4-sulfonic acid halogenide and a salt-forming organic dye as disclosed in J. P. KOKAI Nos. Sho 50-36209 and Sho 53-8128; and a combination of a trihalomethyl compound and a salt-forming organic dye as disclosed in J. P. KOKAI Nos. Sho 53-36223 and Sho 54-74728. Dyes other than the salt-forming organic dyes may also be used as the agent for dyeing image.

Examples of preferred dyes inclusive of salt-forming organic dyes include oil-soluble dyes and basic dyes and more specifically Oil Yellow #101, Oil Yellow #130, Oil Pink #312, Oil Green BG, Oil Blue BOS, Oil Blue #603, Oil Black BY, Oil Black BS, Oil Black T-505 (these are available from ORIENT CHEMICAL INDUSTRIES, LTD.); Victoria Pure Blue, Crystal Violet (CI 42555), Methyl Violet (CI 42535), Rhodamine B (CI 45170B), Malachite Green (CI 42000) and Methylene Blue (CI 52015).

For the diazonium compounds, the following stabilizers can be used: phosphoric acid, phosphorous acid, pyrophosphoric acid, oxalic acid, boric acid, p-toluenesulfonic acid, benzenesulfonic acid, p-hydroxybenzenesulfonic acid, 2-methoxy-4-hydroxy-5-benzoylbenzenesulfonic acid, malic acid, tartaric acid, dipicolinic acid, polyacrylic acid and copolymers thereof, polyvinyl phosphonic acid and copolymers thereof, polyvinylsulfonic acid and copolymers thereof, 5-nitronaphthalene-1-phosphonic acid, 4-chlorophenoxymethyl phosphonic acid, sodium phenyl-methyl-pyrazolone sulfonate, 2-phosphonobutanetricarboxylic acid-1,2,4, 1-phosphonoethanetricarboxylic acid-1,2,2 and 1-hydroxyethane-1,1-disulfonic acid.

Moreover, the light-sensitive composition of the present invention may further comprise other additives, for instance, alkyl ethers for improving coating properties thereof such as ethyl cellulose and methyl cellulose; surfactants such as fluorine type surfactants; plasticizers for imparting flexibility and wear resistance to the resultant film such as tricresyl phosphate, dimethyl phthalate, dibutyl phthalate, trioctyl phosphate, tributyl phosphate, tributyl citrate, polyethylene glycol and polypropylene glycol. The amount of these additives may vary depending on the purposes of the addition thereof, but in general it ranges from 0.5 to 30% by weight on the basis of the total weight of the solid present in the light-sensitive layer.

The light-sensitive composition of the present invention is dissolved in a solvent capable of dissolving the aforementioned components and applied to the surface of a substrate. Examples of such solvents used herein include methanol, ethanol, isopropanol, n-butanol, t-butanol, ethylene dichloride, cyclohexanone, acetone, methyl ethyl ketone, ethylene glycol, ethylene glycol monomethyl ether, ethylene glycol monoethyl ether, 2-methoxyethyl acetate, 1-methoxy-2-propanol, 1-methoxy-2-propyl acetate, N,N-dimethylformamide, tetrahydrofuran, dioxane, dimethylsulfoxide, ethyl acetate, methyl lactate and ethyl lactate. These solvents may be used alone or in combination.

It is also preferred to use mixed solvents obtained by adding, to the solvent listed above or mixture thereof, a small amount of other solvent(s) such as water and toluene which does not dissolve the diazo resins and polymer binders. The concentration of the foregoing components ranges from 1 to 50% by weight (solid content).

After applying such a light-sensitive solution, the applied layer is dried desirably at a temperature of 50° to 120° C. The drying may be carried out by first subjecting the layer to preliminary drying operation at a rather low temperature and then to drying operation at an elevated temperature. The coated layer may directly be dried at an elevated temperature if the solvent and the concentration of the coating solution are properly selected.

The coated amount of the light-sensitive solution varies depending on the applications of the composition. For instance, it ranges from 0.5 to 3.0 g/m² for the composition used to form PS plates. As the coated amount of the composition decreases, the light-sensitivity of the resultant layer increases, but the physical properties thereof are lowered.

Examples of the substrates to which the light-sensitive composition of the invention is applied include paper, paper laminated with a plastic sheet such as a polyethylene, polypropylene or polystyrene sheet; metal plates such as aluminum (inclusive of aluminum alloys), zinc and copper plates; plastic films such as cellulose diacetate, cellulose triacetate, cellulose propionate, cellulose acetate, cellulose acetate butyrate, cellulose butyrate, polyethylene terephthalate, polyethylene, polystyrene, polypropylene, polycarbonate and polyvinyl acetal; and paper or plastic films which are laminated with a foil of the foregoing metals or to which such a metal is deposited. Among these, an aluminum plate is particularly preferred because of its high dimensional stability and low cost. In addition, composite sheets comprising polyethylene terephthalate to which an aluminum sheet is bonded as disclosed in Japanese Patent Publication for Opposition Purpose (hereinafter referred to "J. P. KOKOKU") No. Sho 48-18327 are also preferred.

If the the substrate has a metal surface, in particular an aluminum surface, it is desirable to subject it to hydrophilization treatment.

Examples of such hydrophilization treatments include such a mechanical method as wire brush graining, brush graining in which the aluminum surface is grained with a nylon brush while pouring a slurry of abrasive particles and ball graining; a chemical graining in which HF, AlCl$_3$ and HCl are used as etching agents; electrolytic graining in which nitric acid or hydrochloric acid is used as an electrolyte; and a combined graining composed of a combination thereof. The substrate having aluminum surface may preferably be subjected to etching treatment with an acid or an alkali and subsequently to anodization by passing an electric current (D.C. or A.C.) through the aluminum surface in an electrolyte such as sulfuric acid, phosphoric acid, oxalic acid, boric acid, chromic acid, sulfamic acid or mixture thereof to form a strong passive film on the aluminum surface. The aluminum surface is made hydrophilic by such a passive film per se. However, particularly preferred are those further subjected to silicate (sodium silicate and potassium silicate) treatment as disclosed in U.S. Pat. Nos. 2,714,066 and 3,181,461; potassium fluorozirconate treatment as disclosed in U.S. Pat. No. 2,946,638; phosphomolybdate treatment as disclosed in U.S. Pat. No. 3,201,247; alkyl titanate treatment as disclosed in U.K. Patent No. 1,108,559; polyacrylic acid treatment as disclosed in German Patent No. 1,091,433; polyvinyl sulfonic acid treatment as disclosed in German Patent No. 1,134,093 and U.K. Patent No. 1,230,447; phosphonic acid treatment as disclosed in J. P. KOKOKU No. Sho 44-6409; phytic acid treatment as disclosed in U.S. Pat. No. 3,307,951; a combined treatment composed of treatments with a hydrophilic organic polymer compound and a divalent metal as disclosed in J. P. KOKAI Nos. Sho 58-16893 and Sho 58-18291; application Of an underlying coating of water-soluble polymer having sulfonic acid group(s) as disclosed in J. P. KOKAI No. Sho 59-101651. Furthermore, other examples of hydrophilic treatments also include silicate electrodeposition as disclosed in U.S. Pat. No. 3,658,662.

The light-sensitive composition of the present invention which is applied to the surface of the substrate is imagewise exposed to light through an original transparency carrying line or half-tone dot images and then developed with an aqueous alkali developer to provide relief images negative with respect to the original.

As light sources used in the exposure, there may be named, for instance, a carbon arc lamp, a mercury lamp, a xenon lamp, a metal halide lamp, a strobo, ultraviolet rays and laser beams.

Examples of the aqueous alkaline developer used for development of the PS plates after the light exposure include the developer compositions of J. P. KOKAI No. Sho 51-77401, which comprise benzyl alcohol, anionic surfactant, alkaline agent and water, the developer compositions of J. P. KOKAI No. Sho 53-44202 (=U.S. Pat. No. 4,186,006), which comprise an aqueous solution containing benzyl alcohol, anionic surfactant and water-soluble sulfite salt and the developer composition of J. P. KOKAI No. Sho 55-155355, which comprise water, alkaline agent and an organic solvent whose solubility in water is less than 10% by weight at room temperature.

Though the above-mentioned developers may be used for the light-sensitive composition of the invention, all of these developers contain organic solvents. Organic solvents normally have toxicity, nasty odor and inflammability, i.e., a risk of causing a fire, drainage thereof must satisfy the strict BOD regulations and hence these drawbacks of the organic solvents lead to high cost of the process using them. Therefore, it is desirable to use developers substantially free of organic solvent. The expression of "substantially free of organic solvent" herein means that the content of organic solvent in the developer composition is less than 3% by weight on the basis of the total weight of the composition. The developer composition preferably contains not more than 1%, more preferably 0.5% by weight of organic solvent, and those not containing organic solvent at all are the best.

As examples of the developer substantially free of organic solvent, there can be mentioned the developers used for the development of positive-working PS plates and the like. However, because of the strong alkalinity of those developers, they may cause a rash, inflammation and the like when they contact with human skin.

Therefore, the preferred developer compositions used in the present invention are substantially free of organic solvent and have a pH value of not more than 12.

Preferred examples of the alkaline agent used in the developer composition include mild alkaline agents and salts of weak acid and strong base, for example, organic amines such as monoethanolamine, diethanolamine, triethanolamine, sodium carbonate, potassium carbonate, sodium hydrogen carbonate, potassium hydrogen carbonate, sodium or potassium salt of organic carboxylic acid, primary, secondary and tertiary sodium or potassium salts of phosphoric acid, primary, secondary and tertiary sodium or potassium salts of boric acid and the like. Among those alkaline agents, particularly preferred are the organic amines and the carbonates. The developer preferably contains two or more kinds of the alkaline agents to prevent degradation of the developer.

These alkaline agents are used in an amount of not more than 10% by weight of the developer.

The developer may contain surfactants, for example, anionic surfactants and amphoteric surfactants such as those disclosed in J. P. KOKAI No. Sho 50-51324 and non-ionic surfactants such as those disclosed in J. P. KOKAI Nos. Sho 59-75255 and Sho 60-111246. Those surfactants may be used in an amount of not more than 10%, preferably not more than 6% by weight of the developer.

The developer may further comprise water-soluble sulfites such as sodium sulfite. Those sulfites are used in an amount of not more than 5% by weight of the developer composition.

The developers preferably have a pH value of not more than 12, more preferably of from 8 to 11.5.

When the light-sensitive compositions of the present invention are developed by the developers described above, the polymer binders of the present invention are preferably soluble or dispersible in the developer, though it may be only swellable in the developer. When such a swellable polymer binder is used, it is preferred that the light-sensitive composition of the present invention is mechanically removed by a brush or the like after the immersion in the developer.

The light-sensitive composition of the invention exhibits excellent sensitivity when imagewise exposed to light and hence gives sufficient image with a short exposure time. Accordingly, the composition of the invention remarkably improves the productivity of processes.

EXAMPLES

The present invention will hereinafter be described in more detail with reference to the following non-limitative synthesis examples and working examples and the effects practically achieved by the invention will also be discussed in detail in comparison with comparative examples.

Synthesis Example 1

Synthesis of Macromer (MM-1)

In a flask equipped with a stirrer and a condenser, 2-methoxyethyl acetate (100 g) was heated at 85° C. and stirred under a nitrogen flow.

To this flask, dimethyl-t-butylsilyl methacrylate (95 g), β-mercaptopropionic acid (5 g), 4,4'-azobis(4-cyanovaleric acid) (0.8 g) and 2-methoxyethyl acetate (100 g) were added dropwise at a constant rate over 2.5 hours and further stirred for 3 hours at 85° C.

Then, the mixture was added with glycidyl methacrylate (13.4 g), N,N-dimethyldodecylamine (2 g) and t-butylhydroquinone (1.5 g) and stirred at 110° C. for 8 hours.

After cooling, the reaction mixture was added with p-toluenesulfonic acid (5 g) and 90% by weight aqueous solution of N,N-dimethylacetamide (200 ml), heated at 40° C. and stirred for 1 hour.

After cooling, the reaction mixture was poured into a mixed solution of water and acetone (volume ratio=1:5, 2 liters) to reprecipitate the objective product and the precipitate was collected by decantation. The precipitate was washed with acetone and dried to give a viscous product (68 g). The weight average molecular weight of the product was determined by gel permeation chromatography and found to be 3,800 (standard:polystyrene).

Synthesis Example 2

Synthesis of Macromer (MM-2)

In a flask equipped with a stirrer and a condenser, 2-methoxyethyl acetate (100 g) was heated at 70° C. and stirred under a nitrogen flow.

To this flask, a mixture of ethyl methacrylate (40 g), acrylonitrile (10 g), methacryl acid (50 g), 2-mercaptoethanol (4 g), 2,2'-azobisisobutylonitrile (1.2 g) and 2-methoxyethyl acetate (100 g) was added dropwise at a constant rate over 4 hours and further stirred for 4 hours at 70° C.

Then, the reaction mixture was cooled to room temperature, added with pyridine (12.1 g) and further added with methacrylic acid chloride (16.1 g) dropwise. Thereafter, the reaction mixture was stirred 1 hour at room temperature, added with t-butylhydroquinone (0.5 g) and further stirred for 2 hours at 60° C.

After cooling, the mixture was poured into water (2 liters) with stirring, stirred for 1 hour and left stand to remove the water by decantation. The residue was washed twice with water, dissolved in 1-methoxy-2-propanol (200 ml) and reprecipitated in petroleum ether (2 liters). The precipitate was collected by decantation and dried under reduced pressure to give a viscous product (55 g). The weight average molecular weight of the product was determined by gel permeation chromatography and found to be 4,200 (standard:polystyrene).

Synthesis Example 3

Synthesis of Macromer (MM-3)

In a flask equipped with a stirrer and a condenser, N,N-dimethylacetamide (100 g) was heated at 85° C. and stirred under a nitrogen flow.

To this flask, a mixture of benzyl methacrylate (40 g), 2-hydroxyethyl methacrylate (60 g), 4,4'-azobis(4-cyanovaleric acid) (0.7 g), thioglycolic acid (4 g) and N,N-dimethylacetamide (100 g) was added dropwise at a constant rate over 2.5 hours and further stirred for 3 hours at 85° C.

Then, the mixture was added with glycidyl methacrylate (12 g), N,N-dimethyldodecylamine (2 g) and t-butylhydroquinone (1.2 g) and stirred at 110° C. for 8 hours.

After cooling, the reaction mixture was added with acetic acid (20 g) and poured into water (2 liters) to reprecipitate the objective product and the precipitate was collected by decantation. The precipitate was washed with a mixture of tetrahydrofuran and hexane and dried to give a viscous product.

The obtained viscous product was charged into a flask with N,N-dimethylacetamide (300 g).

Then, the mixture was added with triethylamine (56 g) and succinic anhydride (55.4 g) and stirred for 5 hours at 80° C.

After cooling, the reaction mixture was added with acetic acid (200 g) and poured into water (3 liters) to reprecipitate the objective product and the precipitate was collected by decantation. The precipitate was washed with water and dried to give a viscous product (91 g). The weight average molecular weight of the product was determined by gel permeation chromatography and found to be 6,100 (standard:polystyrene).

Synthesis Examples 4 to 8

Synthesis of Macromers (MM-4 to MM-8)

In the same manner as in Synthesis Examples 1 to 3, the following macromers, MM-4 to MM-8, were synthesized. The weight average molecular weight of these macromers were determined to be 1,500 to 12,000. The appended numbers represent the weight ratios of the structural units in the macromers (standard:polystrene).

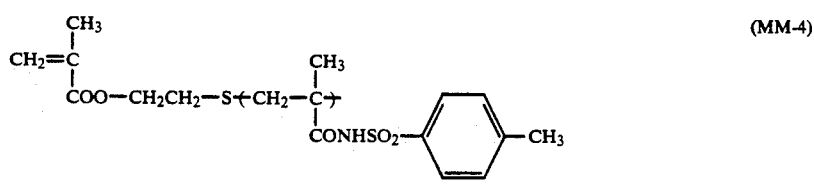
(MM-4)

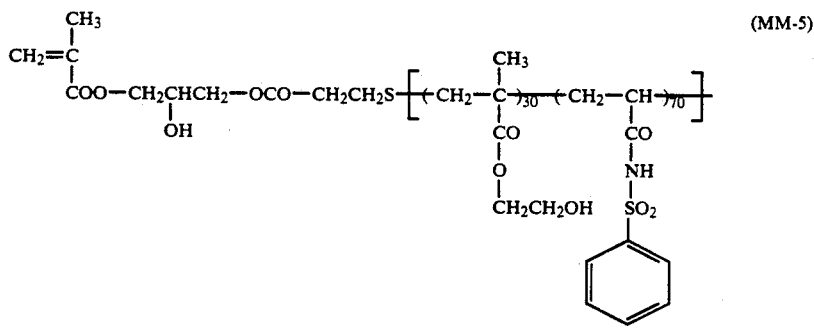
(MM-5)

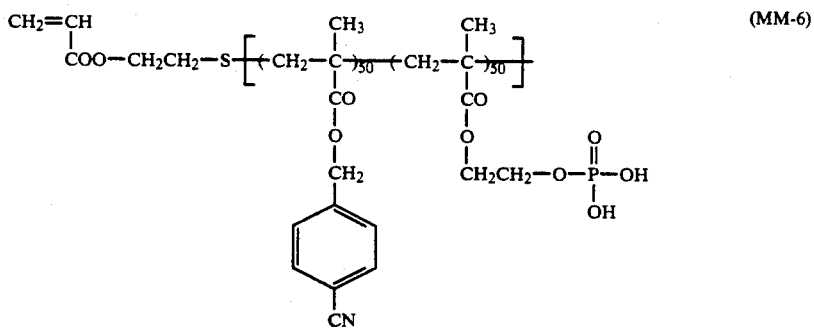
(MM-6)

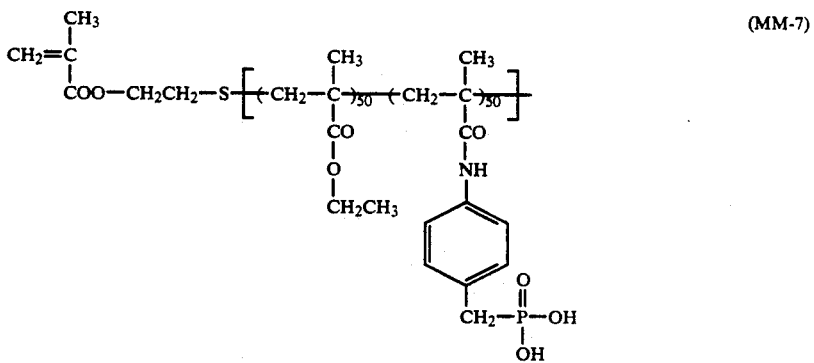
(MM-7)

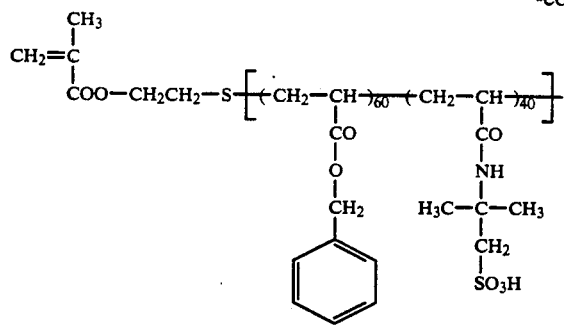
(MM-8)

Synthesis Example 9
Synthesis of Polymer Compound (GP-1)

In a flask equipped with a stirrer and a condenser, the foregoing macromer, MM-1 (20 g), N,N-dimethylacetamide (200 g) and water (50 g) were heated at 75° C. and stirred under a nitrogen flow. To this flask, a mixture of ethyl methacrylate (45 g), 2-hydroxyethyl methacrylate (20 g), acrylonitrile (15 g), 2,2'-azobis(dimethyl isobutyrate) (1 g) and N,N-dimethylacetamide (50 g) was added dropwise at a constant rate over 2.5 hours. After the addition, the reaction mixture was further stirred for 3 hours at 75° C. and poured into water (3 liters) with stirring.

The precipitate was collected by filtration and dried to give a white solid (92 g). The weight average molecular weight of the product was determined by gel permeation chromatography and found to be 32,000 (standard:polystyrene).

Synthesis Example 10
Synthesis of Polymer Compound (GP-2)

In a flask equipped with a stirrer and a condenser, 1-methoxy-2-propanol (50 g) was heated at 75° C. and stirred under a nitrogen flow. To this flask, a mixture of the foregoing macromer, MM-2 (30 g), benzyl methacrylate (60 g), 2-hydroxyethyl acrylate (10 g), 2,2'-azobis(dimethyl isobutyrate) (1 g) and 1-methoxy-2-propanol (250 g) was added dropwise at a constant rate over 2.5 hours. After the addition, the reaction mixture was further stirred for 3 hours at 75° C. and poured into water (3 liters) with stirring.

The precipitate was collected by filtration and dried to give a white solid (89 g). The weight average molecular weight of the product was determined by gel permeation chromatography and found to be 41,000 (standard:polystyrene).

Synthesis Examples 11 to 16
Synthesis of Polymer Compounds (GP-3 to GP-8)

In the same manner as in Synthesis Examples 9 and 10, polymer compounds GP-3 to GP-8 were synthesized. The weight average molecular weight of these macromers were determined to be 27,000 to 120,000 (standard:polystyrene). The macromers and the monomers used in the syntheses of the polymer compounds are summarized in Table 1 below.

TABLE 1

| Polymer Compound | Used Macromer (Weight ratio) | Used Monomer (Weight ratio) | | |
|---|---|---|---|---|
| GP-1 | MM-1 (20) | $CH_2=C(CH_3)COOCH_2CH_3$ (45) | $CH_2=C(CH_3)COOCH_2CH_2OH$ (20) | $CH_2=CH-CN$ (15) |
| GP-2 | MM-2 (30) | $CH_2=C(CH_3)COOCH_2-C_6H_5$ (60) | $CH_2=CH-COOCH_2CH_2OH$ (10) | |
| GP-3 | MM-3 (30) | $CH_2=C(CH_3)COOCH_3$ (60) | $CH_2=CH-CN$ (10) | |
| GP-4 | MM-4 (25) | $CH_2=CH-COOCH_2CH_2CH_2CH_3$ (30) | $CH_2=C(CH_3)COOCH_2CH_2OH$ (35) | $CH_2=C(CH_3)COOH$ (10) |

TABLE 1-continued

| Polymer Compound | Used Macromer (Weight ratio) | Used Monomer (Weight ratio) | | |
|---|---|---|---|---|
| GP-5 | MM-5 (20) | $CH_2=C(CH_3)CONH\text{-}C_6H_4\text{-}SO_2NH_2$ (10) | $CH_2=C(CH_3)COOCH_3$ (55) | $CH_2=C(CH_3)COOH$ (15) |
| GP-6 | MM-6 (30) | $CH_2=C(CH_3)COOCH_2CH_2OCH_2CH_2OCH_3$ (10) | $CH_2=C(CH_3)COOCH_2CH_3$ (60) | |
| GP-7 | MM-7 (15) | $CH_2=C(CH_3)CONH\text{-}C_6H_4\text{-}OH$ (20) | $CH_2=C(CH_3)COOCH_3$ (55) | $CH_2=C(CH_3)COOH$ (10) |
| GP-8 | MM-8 (10) | $CH_2=C(CH_3)COOCH_2CH(CH_2CH_3)CH_2CH_2CH_3$ (60) | $CH_2=CH\text{-}CN$ (20) | $CH_2=C(CH_3)COOH$ (10) |

Synthesis of Comparative Polymer Compounds (LP-1 to LP-4)

By following the same procedure as the synthesis of the polymer compound GP-1 except that methacryl acid was used instead of the macromer MM-1, the comparative polymer compound LP-1 shown in Table 2 below was prepared. The weight average molecular weight of LP-1 was determined by gel permeation chromatography and found to be 29,000 (standard:polystyrene).

In the same manner as above, comparative polymer compounds LP-2 to LP-4 ware prepared. The weight average molecular weight of these comparative polymer compounds were determined to be 25,000 to 110,000 (standard:polystyrene). The monomers used in the syntheses of the comparative polymer compounds are summarized in Table 2 below.

TABLE 2

| Polymer Compound | Used Monomer (Weight ratio) | | | |
|---|---|---|---|---|
| LP-1 | CH$_2$=C(CH$_3$)COOH (20) | CH$_2$=C(CH$_3$)COOCH$_2$C$_6$H$_4$CONHSO$_2$CH$_3$ (25) | CH$_2$=C(CH$_3$)COOCH$_2$CH$_3$ (45) | CH$_2$=C(CH$_3$)COOCH$_2$CH$_2$OH (20) | CH$_2$=CH-CN (15) |
| LP-2 | CH$_2$=C(CH$_3$)COOCH$_2$-C$_6$H$_4$-CN (15) | CH$_2$=CH-COOCH$_2$CH$_2$CH$_2$CH$_3$ (30) | CH$_2$=C(CH$_3$)COOCH$_2$CH$_2$OH (35) | CH$_2$=C(CH$_3$)COOH (10) | |
| LP-3 | | CH$_2$=C(CH$_3$)COOCH$_2$CH$_2$-O-P(=O)(OH)$_2$ (15) | CH$_2$=C(CH$_3$)COOCH$_2$CH$_2$OCH$_2$CH$_2$OCH$_3$ (10) | CH$_2$=C(CH$_3$)COOCH$_2$CH$_3$ (60) | |
| LP-4 | CH$_2$=CH-COOCH$_2$-C$_6$H$_5$ (6) | CH$_2$=CH-CO-NH-C(CH$_3$)$_2$-CH$_2$-SO$_3$H (4) | CH$_2$=C(CH$_3$)COOCH$_2$CH(CH$_2$CH$_3$)CH$_2$CH$_2$CH$_2$CH$_3$ (60) | CH$_2$=CH-CN (20) | CH$_2$=C(CH$_3$)COOH (10) |

EXAMPLE 1

Substrates for PS plates were prepared according to the method disclosed in J. P. KOKAI Sho 56-28893. The surface of an aluminum plate having a thickness of 0.24 mm was grained using a nylon brush and an aqueous suspension of 400 mesh pumice stone and then sufficiently washed with water. The plate was immersed in 10% aqueous solution of sodium hydroxide at 70° C. for 60 seconds to etch the plate, followed by washing with running water, neutralizing and washing with 20% nitric acid solution and washing with water. Then, the plate was electrolytically grained in 1% aqueous nitric acid solution utilizing an alternating waved current with the conditions of the ratio of the quantity of electricity at the cathode time to that of at the anode of 0.8 and the quantity of electricity at the anode time of 160 coulomb/dm². The surface roughness at this stage was determined and found to be 0.6 μm (Ra unit). Subsequently, the aluminum plate was immersed in 30% aqueous sulfuric acid solution at 55° C. for two minutes to desmut the plate and was anodized in 20% sulfuric acid solution until the thickness of the resultant aluminum oxide film was 2.7 g/m². Thereafter, the plate was immersed in 2.5% aqueous solution of sodium silicate maintained at 70° C. for one minute, then washed with water and dried. Solutions of light-sensitive compositions having the following composition (hereinafter referred to as "light-sensitive solution(s)"), [V]-1 to [V]-8, were applied to the surface of the aluminum plate thus prepared using a whirler and dried at 100° C. for two minutes. The amount of the composition applied was 2.0 g/m² (weighed after drying).

The polymer compounds of the invention used in the light-sensitive solutions [V]-1 to [V]-8 are listed in Table 3 below.

| Light-sensitive Solution [V] | |
|---|---|
| Component | Amount (g) |
| Polymer compound of the invention (Table 3) | 5.0 |
| 4-n-Dodecylbenzenesulfonic acid salt of the condensate of 4-diazodiphenylamine, phenoxyacetic acid and formaldehyde | 0.5 |
| Oil-soluble dye (Victoria Pure Blue BOH) | 0.1 |
| Malic acid | 0.05 |
| FC-430 (fluorine type surfactant available from U.S. 3M Co., Ltd.) | 0.05 |
| 2-Methoxy-2-propanol | 100 |

In addition, light-sensitive solutions [W]-1 to [W]-4 containing the comparative polymer compounds LP-1 to LP-4 instead of the polymer compound of the invention in the light-sensitive solution [V] described above were applied to the same aluminum substrates. The amount of the composition applied was 2.0 g/m² (weighed after drying). The comparative polymer compounds used in the light-sensitive solutions [W]-1 to [W]-4 are also listed in Table 3 below.

Gray scale tablets (available from Fuji Photo Film Co., Ltd.) were put on the PS plates [V]-1 to [V]-8 and [W]-1 to [W]-4, which were obtained by using the light-sensitive solutions [V]-1 to [V]-8 and [W]-1 to [W]-4, and imagewise exposed to light for one minute using a PS Light (available from Fuji Photo Film Co., Ltd.) disposed at a distance of 1 m therefrom, immersed in the following developers [S] for 50 seconds and then the surface thereof was lightly rubbed with a brush to remove the unexposed portions. The developer had a pH value of not more than 12.

| Developer [S] | |
|---|---|
| Component | Amount (g) |
| NaHCO₃ | 10 |
| Na₂CO₃ | 20 |
| Naphthalene derivative with C₄H₉ and SO₃Na substituents | 50 |
| Water | 920 |

Sensitivity of the PS plates to the quantity of light to which the plates were exposed was evaluated by visually determining the number of solid steps. The results are shown in Table 3. As seen from the results of Table 3, all of the PS plates utilizing the light-sensitive compositions of the invention [V]-1 to [V]-8 exhibited higher solid step numbers than the comparative PS plates [W]-1 to [W]-4, and this means that the light-sensitive compositions of the invention have higher sensitivities as compared with the comparative light-sensitive compositions.

TABLE 3

| PS plate | Polymer Compound | Number of Solid Steps |
|---|---|---|
| [V]-1 | GP-1 | 6 |
| [V]-2 | GP-2 | 6 |
| [V]-3 | GP-3 | 5 |
| [V]-4 | GP-4 | 5 |
| [V]-5 | GP-5 | 6 |
| [V]-6 | GP-6 | 6 |
| [V]-7 | GP-7 | 5 |
| [V]-8 | GP-8 | 5 |
| Comparative Examples | | |
| [W]-1 | LP-1 | 4 |
| [W]-1 | LP-1 | 3 |
| [W]-1 | LP-1 | 4 |
| [W]-1 | LP-1 | 3 |

EXAMPLE 2

Gray scale tablets (available from Fuji Photo Film Co., Ltd.) were put on the PS plates [V]-1 and [W]-1 and imagewise exposed to light for one minute using a PS Light (available from Fuji Photo Film Co., Ltd.) disposed at a distance of 1 m therefrom, immersed in either of the following developers [T] and [U] for 50 seconds and then the surface thereof was lightly rubbed with a brush to remove the unexposed portions. The developers had a pH value of not more than 12.

| Component | Amount (g) |
|---|---|
| Developer [T] | |
| NaHCO₃ | 15 |
| Na₂CO₃ | 25 |
| Water | 960 |
| Developer [U] | |
| Triethanolamine | 20 |
| Monoethanolamine | 2 |
| Water | 978 |

Sensitivity of the PS plates to the quantity of light to which the plates were exposed was evaluated by visually determining the number of solid steps. The results are shown in Table 4. As seen from the results of Table 4, the PS plates [V]-1 utilizing the light-sensitive composition of the invention exhibited higher solid step numbers than the comparative PS plates [W]-1, and this means that the light-sensitive composition of the invention have a higher sensitivity as compared with the comparative light-sensitive composition.

TABLE 4

| PS plate | Developer | Number of Solid Steps |
| --- | --- | --- |
| [V]-1 | [T] | 6 |
| [V]-1 | [U] | 5 |
| Comparative Examples | | |
| [W]-1 | [T] | 4 |
| [W]-1 | [U] | 3 |

What is claimed is:

1. A light-sensitive composition comprising, in admixture, a diazonium compound and a polymer binder, wherein the polymer binder comprises structural units represented by the following formula (I);

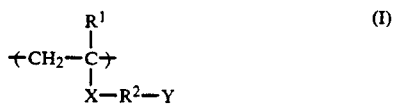

wherein $R^1$ represents a hydrogen atom or methyl group; X represents a single bond, an ester bond or an amide bond; $R^2$ represents a single bond or a divalent bridging group comprised of two or more kinds of atoms selected from the group consisting of C, H, N, O and S; and Y represents a polymer group having a weight average molecular weight of not less than 500 and comprising structural units represented by the following formula (II);

where $R^3$ represents a hydrogen atom or methyl group; $R^4$ represents a single bond or a divalent bridging group comprised of two or more kinds of atoms selected from the group consisting of C, H, N, O and S; and Z represents

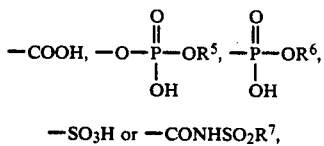

$-SO_3H$ or $-CONHSO_2R^7$, where $R^5$ and $R^6$ independently represent a hydrogen atom or a hydrocarbon group having 1 to 15 carbon atoms; and $R^7$ represents a hydrocarbon group having 1 to 15 carbon atoms.

2. The light-sensitive composition of claim 1, wherein the polymer binder comprising the units of the formula (I) is obtained by radical polymerization of a macromer represented by the following formula (III);

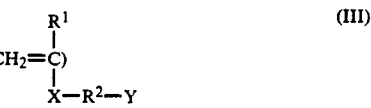

wherein $R^1$ represents hydrogen atom or methyl group; X represents a single bond, an ester bond or an amide bond; $R^2$ represents a single bond or a divalent bridging group composed of two or more kinds of atoms selected from the group consisting of C, H, N, O and S; and Y represents a polymer group having a weight average molecular weight of not less than 500 and comprising structural units represented by the following formula (II);

where $R^3$ represents hydrogen atom or methyl group; $R^2$ represents a single bond or a divalent bridging group composed of two or more kinds of atoms selected from the group consisting of C, H, N, O and S; and Z represents

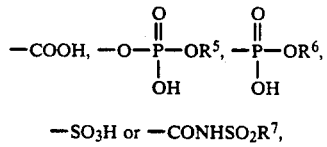

$-SO_3H$ or $-CONHSO_2R^7$, where $R^5$ and $R^6$ independently represent hydrogen atom a hydrocarbon group having 1 to 15 carbon atoms; and $R^7$ represents a hydrocarbon group having 1 to 15 carbon atoms.

3. The light-sensitive composition of claim 2, wherein the macromer is prepared by polymerizing monomers having an acidic group protected by a suitable protective group through radical polymerization in the presence of a chain transfer agent or a polymerization initiator having a reactive group, reacting the resulted oligomer with a compound having a polymerizable double bond to introduce the double bond into the oligomer and removing the protective groups.

4. The light-sensitive composition of claim 2, wherein the macromer is prepared by polymerizing monomers having an acidic group protected by a suitable protective group through radical polymerization in the presence of a chain transfer agent or a polymerization initiator having a reactive group, removing the protective groups of the resulted oligomer and reacting the oligomer with a compound having a polymerizable double bond to introduce the double bond into the oligomer by utilizing difference of reactivity between the reactive group and the acidic group contained in the oligomer.

5. The light-sensitive composition of claim 2, wherein the macromer is prepared by polymerizing monomers having a group which may be substituted with an acidic group through radical polymerization in the presence of a chain transfer agent or a polymerization initiator having a reactive group, reacting the resulted oligomer with a compound having a polymerizable double bond to introduce the double bond into the oligomer and introducing acidic groups into the oligomer at the substitutable groups.

6. The light-sensitive composition of claim 1, wherein the structural units represented by formula (II) have a weight average molecular weight of not less than 500 and are selected from the group consisting of the following units:

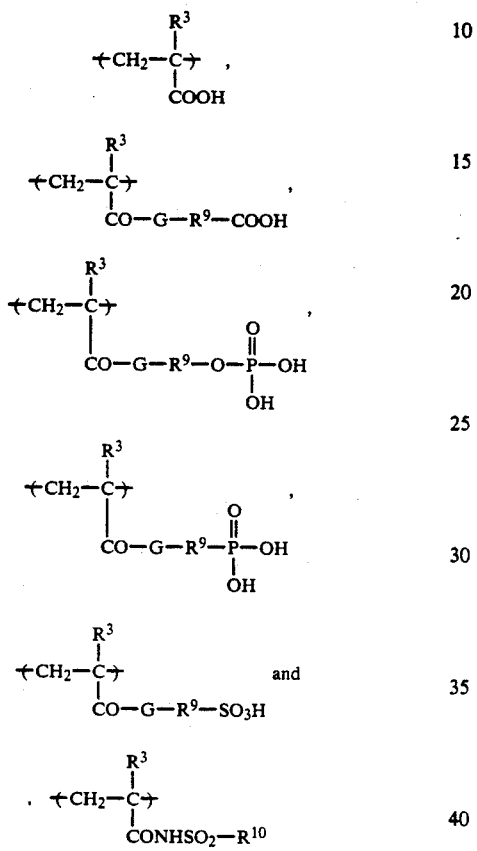

wherein $R^3$ represents a hydrogen atom or methyl group; G represents —O— or —NH—; $R^9$ represents a hydrocarbon bridging group having 1 to 15 carbon atoms and $R^{10}$ represents a hydrocarbon group having 1 to 15 carbon atoms.

7. The light-sensitive composition of claim 6, wherein the structural units represented by formula (II) have a weight average molecular weight of not less than 500 and are selected from the group consisting of the following units:

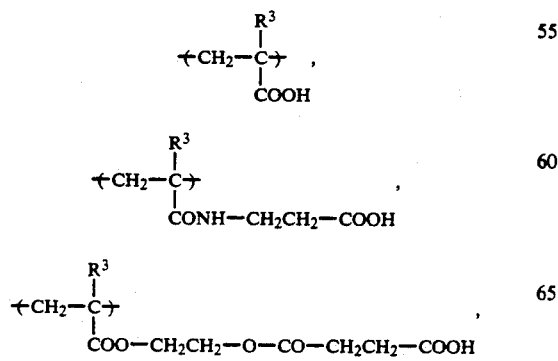

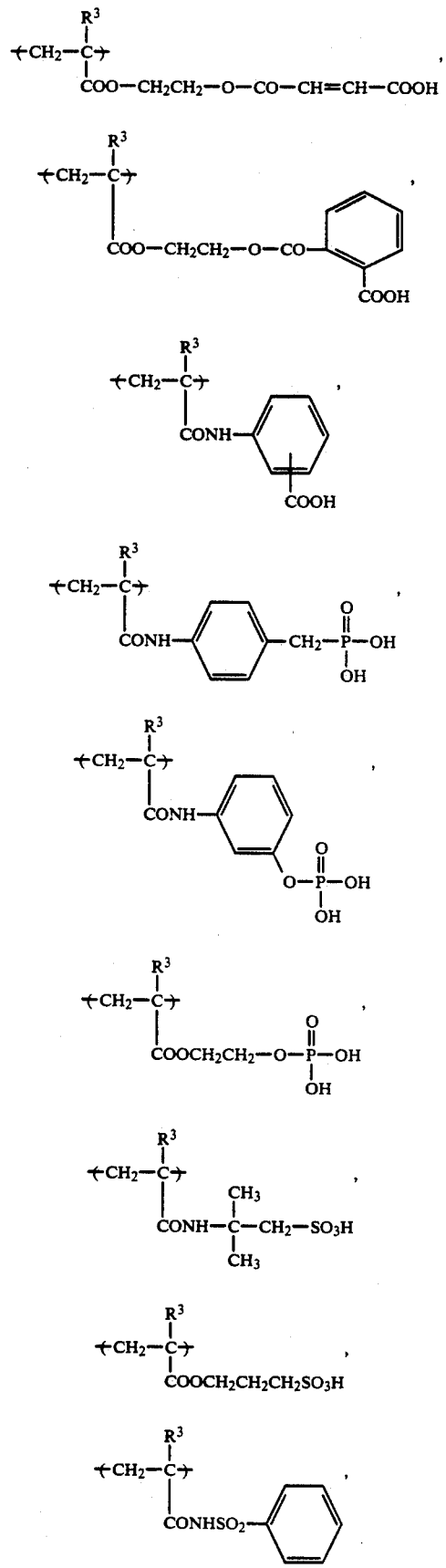

-continued

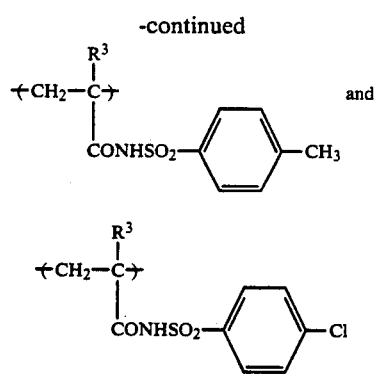

wherein R³ represents a hydrogen atom or methyl group.

8. The light-sensitive composition of claim 1, wherein the structural units represented by formula (I) comprises, in addition to the structural units represented by the formula (II), structural units selected from the group consisting of those derived from acrylates, acrylamides, methacrylates, methacrylamides, allyl compounds, vinyl ethers, vinyl esters, styrenes, crotonates, acrylonitrile and methacrylonitrile.

9. The light-sensitive composition of claim 8, wherein the structural units represented by formula (I) comprises structural units selected from the group consisting of those derived from acrylates, methacrylates, acrylamides, methacrylamides, acrylonitrile and methacrylonitrile.

10. The light-sensitive composition of claim 1, wherein the group Y in the formula (I) consists of 20 to 100% by weight of the structural units of the formula (II).

11. The light-sensitive composition of claim 1, wherein the polymer binder comprises, in addition to the structural units represented by the formula (I), other structural units selected from the group consisting of those derived from acrylates, acrylamides, methacrylates, methacrylamides, allyl compounds, vinyl ethers, vinyl esters, styrenes, crotonates acrylonitrile, methacrylonitrile, acrylic acid and methacrylic acid.

12. The light-sensitive composition of claim 11, wherein the polymer binder comprises structural units selected from the group consisting of those derived from acrylates, methacrylates, acrylamides, methacrylamides, acrylonitrile, methacrylonitrile, acrylic acid and methacrylic acid.

13. The light-sensitive composition of claim 1, wherein the polymer binder comprises 5 to 80% by weight of the structural units of the formula (I).

14. The light-sensitive composition of claim 1, wherein the polymer binder comprises two or more kinds of the structural units of the formula (I).

15. The light-sensitive composition of claim 1, wherein the polymer binder comprises the structural units of the formula (II) in the backbone thereof.

16. The light-sensitive composition of claim 2, wherein the weight average molecular weight of the macromer ranges from 700 to 200,000.

17. The light-sensitive composition of claim 1, wherein the polymer binder has an average molecular weight ranging from 5,000 to 3,000, a number average molecular weight ranging from 1,000 to 250, 000 and a polydispersity ranging from 1.1 to 10.

18. The light-sensitive composition of claim 1, which comprises about 10 to 90% by weight of the polymer binder on the basis of the total weight of the composition.

19. The light-sensitive composition of claim 1, which comprises 3 to 35% by weight of the diazonium compound on the basis of the total weight of the composition.

20. The light-sensitive composition of claim 1, which comprises, in addition to the polymer binder containing the structural units represented by the formula (I), an alkali-soluble polymer compound selected from the group consisting of phenol-formaldehyde resin, cresol-formaldehyde resin, phenol modified xylene resin, polyhydroxystyrene, polyhalogenated hydroxystyrene, carboxyl group-containing epoxy resin, polyacetal resin, acrylic resin, methacrylic resin and carboxyl group-containing polyurethane resin in an amount of not more that 70% by weight of the total weight of the composition.

* * * * *